United States Patent
Huang et al.

(10) Patent No.: US 8,088,668 B2
(45) Date of Patent: Jan. 3, 2012

(54) METHOD FOR MANUFACTURING CAPACITOR LOWER ELECTRODES OF SEMICONDUCTOR MEMORY

(75) Inventors: Shin Bin Huang, Hsinchu County (TW); Chung-Yi Chang, Keelung (TW); Jung-Hung Wang, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 39 days.

(21) Appl. No.: 12/700,088

(22) Filed: Feb. 4, 2010

(65) Prior Publication Data

US 2011/0076828 A1   Mar. 31, 2011

(30) Foreign Application Priority Data

Sep. 30, 2009 (TW) .............................. 98133199 A

(51) Int. Cl.
*H01L 21/20* (2006.01)
(52) U.S. Cl. ................ 438/396; 438/387; 257/E21.011; 257/E21.008
(58) Field of Classification Search .................. 438/396, 438/387, 253, 514, 386, 381; 257/E21.011, 257/E21.648, E21.008, E21.646, E21.651
See application file for complete search history.

(56) References Cited

U.S. PATENT DOCUMENTS

| | | | | |
|---|---|---|---|---|
| 7,902,581 | B2* | 3/2011 | Frohberg et al. | 257/296 |
| 2005/0099259 | A1* | 5/2005 | Harris et al. | 336/200 |
| 2007/0161201 | A1* | 7/2007 | Yamamoto | 438/396 |
| 2007/0249164 | A1* | 10/2007 | Chen et al. | 438/638 |
| 2007/0257323 | A1* | 11/2007 | Tsui et al. | 257/382 |
| 2007/0267674 | A1* | 11/2007 | Lin et al. | 257/306 |
| 2007/0269955 | A2* | 11/2007 | Yamamoto | 438/396 |
| 2008/0185730 | A1* | 8/2008 | Lung | 257/774 |
| 2011/0076828 | A1* | 3/2011 | Huang et al. | 438/396 |

* cited by examiner

*Primary Examiner* — Walter L Lindsay, Jr.
(74) *Attorney, Agent, or Firm* — Rosenberg, Klein & Lee

(57) ABSTRACT

A method for manufacturing capacitor lower electrodes of a semiconductor memory firstly forms a first stacked structure over a semiconductor substrate which has a plurality of conductive plugs. Then a second stacked structure is formed on the first stacked structure; furthermore, a plurality of trenches extending from a top surface of the second stacked structure to a bottom surface of the first stacked structure are formed and expose the conducting plugs; finally, conductive metal materials and solid conducting cylindrical structures are deposited in the trenches in turn, and the conductive metal materials contact with the conductive plugs and the conducting cylindrical structures. Each conducting cylindrical structure is a capacitor lower electrode. Accordingly, the present invention can increase the supporting stress of the capacitor lower electrodes and further reduce the difficulty in disposing of capacitor upper electrodes and capacitor dielectric layers outside the capacitor lower electrodes.

18 Claims, 8 Drawing Sheets

METHOD FOR MANUFACTURING CAPACITOR LOWER ELECTRODES OF SEMICONDUCTOR MEMORY

BACKGROUND OF THE INVENTION

1. Field of the Invention

The present invention relates to a method for manufacturing a capacitor electrode, and more particularly to a method for manufacturing capacitor lower electrodes of a dynamic random access memory.

2. Description of Related Art

Dynamic random access memory is one kind of semiconductor memory. Each memory cell of a dynamic random access is composed of a field effect transistor and a capacitor, and a source or a drain of the field effect transistor is electrically connected with the capacitor. Capacitors can be categorized into stacked type capacitors and deep trench type capacitors, wherein the stacked type capacitors are directly formed over surfaces of semiconductor substrates containing field effect transistors and the deep trench type capacitors are formed in semiconductor substrates.

As shown in FIGS. 1-4, a conventional method for manufacturing capacitor lower electrodes of a semiconductor memory is provided. At first, the method comprises: fabricating a semiconductor substrate 1a which has a source or a drain of a field effect transistor (not shown) electrically connected with a plurality of conductive plugs 11a; secondly, forming a stacked structure 2a on an upper surface of the semiconductor substrate 1a, wherein the stacked structure 2a includes an insulating oxide layer 21a, a dielectric layer 22a and an insulating nitride layer 23a from bottom to top, and the insulating oxide layer 21a, the dielectric layer 22a and the insulating nitride layer 23a have different etching rates for acid. As shown in FIG. 2, after the stacked structure 2a is formed, partial etching of the insulating oxide layer 21a, the dielectric layer 22a and the insulating nitride layer 23a eventually forms a plurality of trenches 24a, so that the conductive plugs 11a are exposed in the trenches 24a. Then, a conductive metal material 25a is disposed within each trench 24a so as to contact with the conductive plugs 11a; a plurality of U-shaped capacitor lower electrodes 26a are formed in each trench 24a; the capacitor lower electrodes 26a are deposited onto the conductive metal materials 25a; the insulating nitride layer 23a and the capacitor lower electrodes 26a are partially etched as shown in FIG. 3 and FIG. 4; and the dielectric layer 22a is etched and removed.

To improve data storage capacity of memories, density of memory cells must be increased. The solution for solving the problem is to decrease dimensions in a semiconductor fabrication process. However, when dimensions are getting smaller, the semiconductor fabrication, processing of the U-shaped capacitor lower electrodes 26a is getting more difficult, and because the supporting stress becomes lower, it results in being more difficult to fabricate the dielectric layer and capacitor upper electrodes outside the capacitor lower electrodes.

SUMMARY OF THE INVENTION

A main objective of the present invention is to provide a method for manufacturing capacitor lower electrodes of a semiconductor memory which increases a supporting stress of the capacitor lower electrodes and reduces the difficulty in disposing of capacitor upper electrodes and capacitor dielectric layers outside the capacitor lower electrodes.

To achieve the above-mentioned objective, a method for manufacturing capacitor lower electrodes of a semiconductor memory in accordance with the present invention is provided. The method includes the steps of: forming a first stacked structure on a semiconductor substrate which has a plurality of conductive plugs; forming a second stacked structure on the first stacked structure; etching the first stacked structure and the second stacked structure to form a plurality of trenches extending from a top surface of the second stacked structure to a bottom surface of the first stacked structure, the conducting plugs exposed in the trenches; disposing a conductive metal material within each of the trenches, the conductive metal materials are deposited onto the conductive plugs; and disposing a cylindrical capacitor lower electrode within each of the trenches, the capacitor lower electrodes are deposited onto the conductive metal materials.

The efficacy of the present invention is as follows: the solid-cylindrical capacitor lower electrodes have a high supporting stress, which can reduce the difficulty in disposing of capacitor upper electrodes and capacitor dielectric layers outside the capacitor lower electrodes. On the other hand, comparing with conventional U-shaped capacitor lower electrodes, the solid-cylindrical capacitor lower electrodes have a larger surface area for storing more electric charges.

DETAILED DESCRIPTION OF THE PREFERRED EMBODIMENTS

Figure 1:
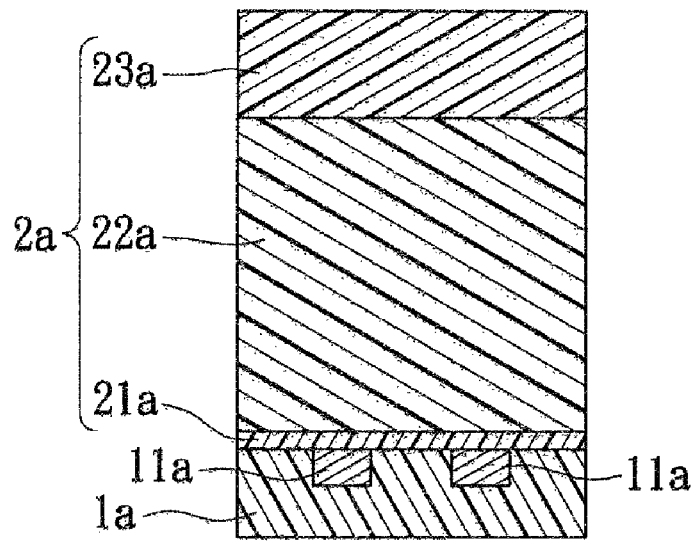
FIG. 1 is a first cross-sectional view showing a step of a conventional method for manufacturing capacitor lower electrodes of a semiconductor memory.
Figure 2:
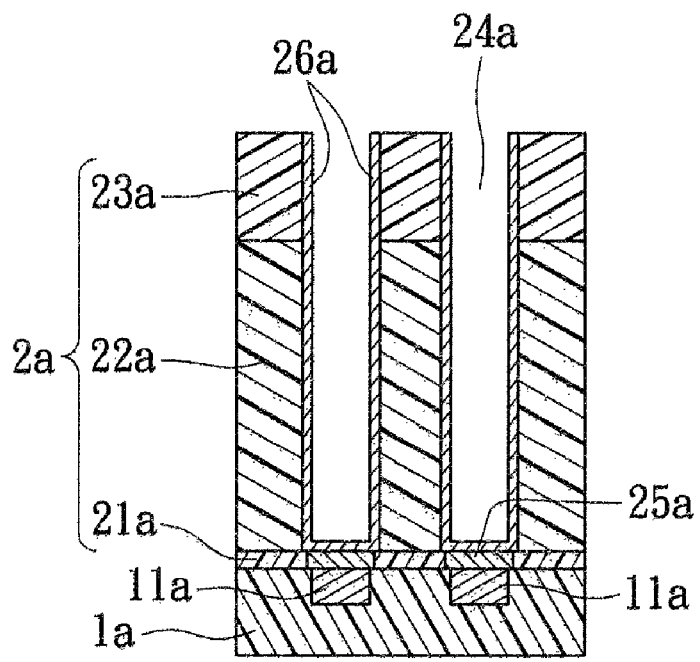
FIG. 2 is a second cross-sectional view showing a step of the conventional method for manufacturing capacitor lower electrodes of a semiconductor memory.
Figure 3:
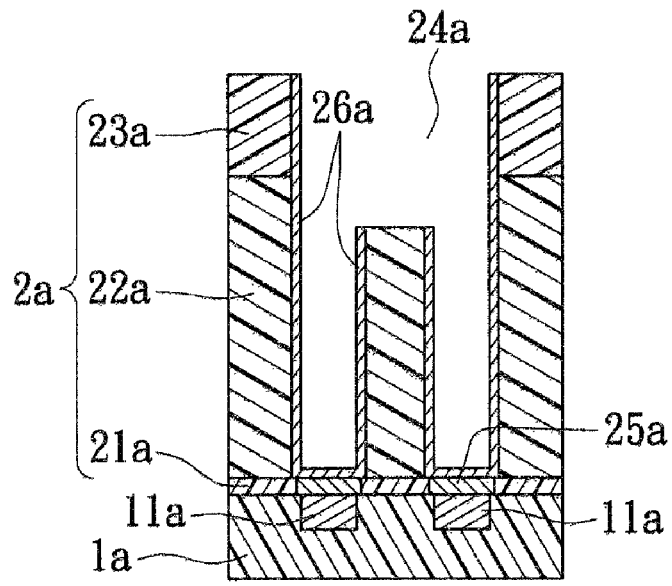
FIG. 3 is a third cross-sectional view showing a step of the conventional method for manufacturing capacitor lower electrodes of a semiconductor memory.
Figure 4:
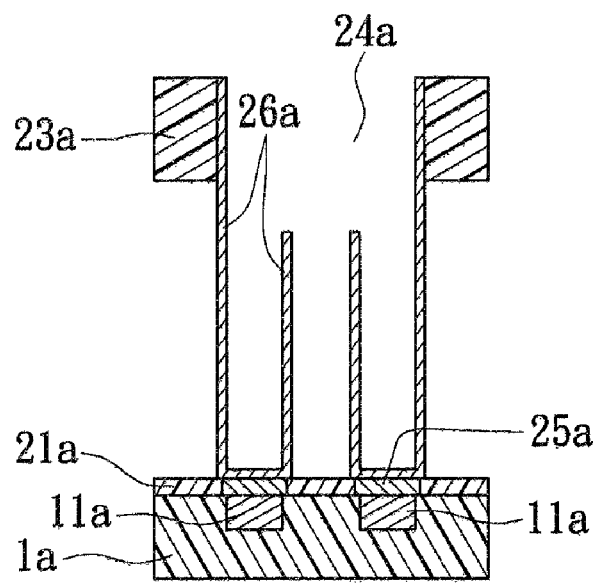
FIG. 4 is a fourth cross-sectional view showing a step of the conventional method for manufacturing capacitor lower electrodes of a semiconductor memory.
Figure 5:
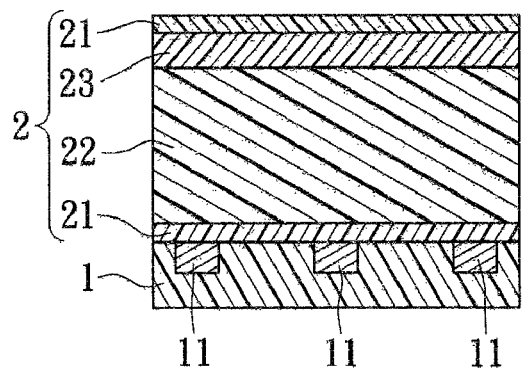
FIG. 5 is a first cross-sectional view showing a step of a first embodiment of a method for manufacturing capacitor lower electrodes of a semiconductor memory of the present invention.

FIGS. 5-15 illustrate steps of a method for manufacturing capacitor lower electrodes of a semiconductor memory according to the present invention, wherein the semiconductor memory is a dynamic random access memory. As shown in FIG. 5, the method comprises: at first, fabricating a semiconductor substrate 1 in which a plurality of conductive plugs 11 embedded made from polysilicon materials are electrically connected with sources or drains (not shown) of field effect transistors; and forming a first stacked structure 2 on an upper surface of the semiconductor substrate 1, wherein the first stacked structure 2 includes two first insulating oxide layers 21, a first dielectric layer 22 and a first insulating nitride layer 23. Therein, the first dielectric layer 22 and the first insulating nitride layer 23 are interposed there between the two first insulating oxide layers 21. The first insulating nitride layer 23 is deposited onto the first dielectric layer 22, and the material of the first dielectric layer 22 is insulating oxide or polysilicon.

Figure 6:
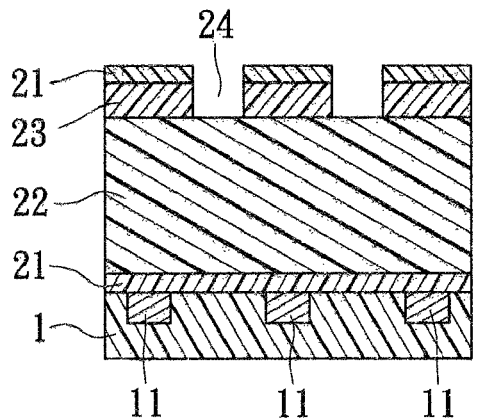
FIG. 6 is a second cross-sectional view showing a step of the first embodiment of the method for manufacturing capacitor lower electrodes of a semiconductor memory of the present invention.
Figure 7:
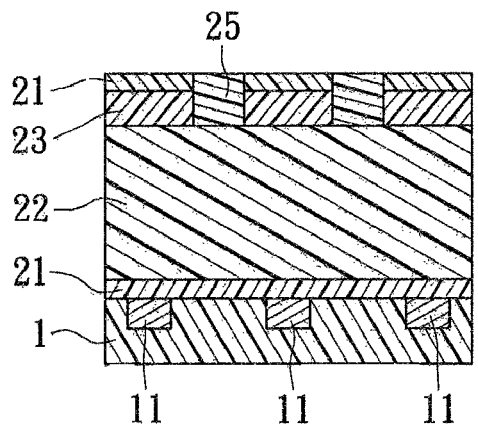
FIG. 7 is a third cross-sectional view showing a step of the first embodiment of the method for manufacturing capacitor lower electrodes of a semiconductor memory of the present invention.

Secondly, as shown in FIG. 6 and FIG. 7, the first insulating oxide layers 21 and the first insulating nitride layer 23 are etched to form a plurality of first grooves 24, and then embed a plurality of first dielectric boards 25 in the first grooves 24, wherein the material of the first dielectric boards 25 is insulating oxide or polysilicon.

Figure 8:
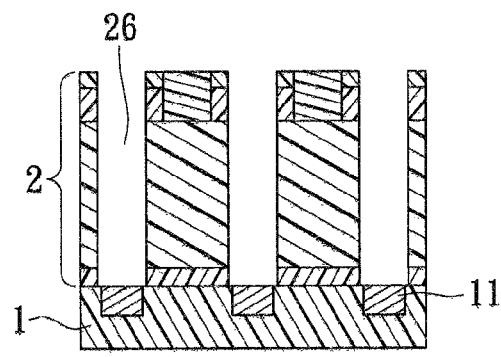
FIG. 8 is a fourth cross-sectional view showing a step of the first embodiment of the method for manufacturing capacitor lower electrodes of a semiconductor memory of the present invention.

As shown in FIG. 8, after the first dielectric boards 25 are embedded in the first grooves 24, partial etching of the two first insulating oxide layers 21, the first insulating nitride layer 23 and the first dielectric layer 22 forms a plurality of first trenches 26 for the exposure of the conductive plugs 11.

Figure 9:
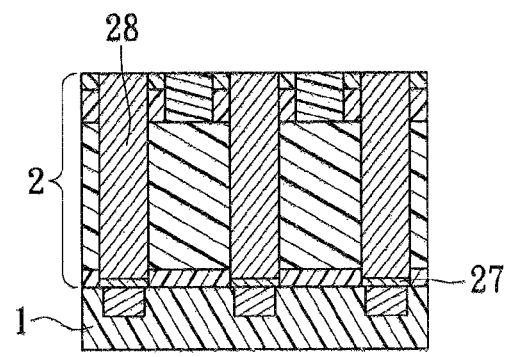
FIG. 9 is a fifth cross-sectional view showing a step of the first embodiment of the method for manufacturing capacitor lower electrodes of a semiconductor memory of the present invention.

As shown in FIG. 9, after the plurality of first trenches 26 is formed, a conductive metal material 27 is disposed within each first trench 26. The conductive metal materials 27 are titanium metal materials and are deposited onto the upper surfaces of the conductive plugs 11 to achieve the electrical connection. After the conductive metal materials 27 are disposed in the first trenches 26, a solid first conducting cylindrical structure 28 in each first trench 26 is interposed. The material of the first conducting cylindrical structures 28 is titanium nitride. The first conducting cylindrical structures 28 are deposited over the upper surfaces of the conductive metal materials 27 to achieve electrical connection.

Figure 10:
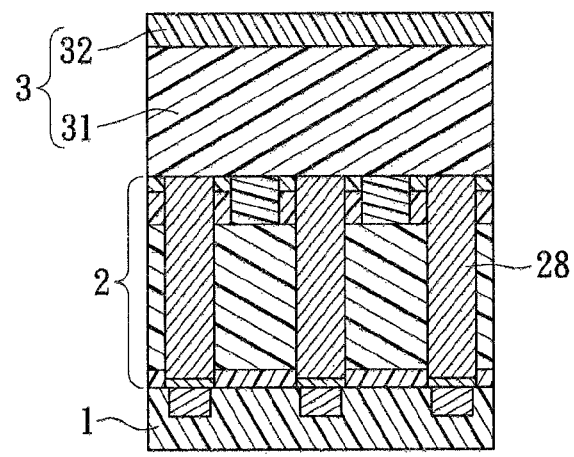
FIG. 10 is a sixth cross-sectional view showing a step of the first embodiment of the method for manufacturing capacitor lower electrodes of a semiconductor memory of the present invention.

Furthermore, as shown in FIG. 10, the top surface of the first stacked structure 2 embedded the first conducting cylindrical structures 28 is smoothed and polished via chemical mechanical polishing and further a second stacked structure 3 is disposed on the first stacked structure 2. The second stacked structure 3 includes a second dielectric layer 31 and a second insulating nitride layer 32 from bottom to top, and the material of the second dielectric layer 31 is insulating oxide or polysilicon.

Figure 11:
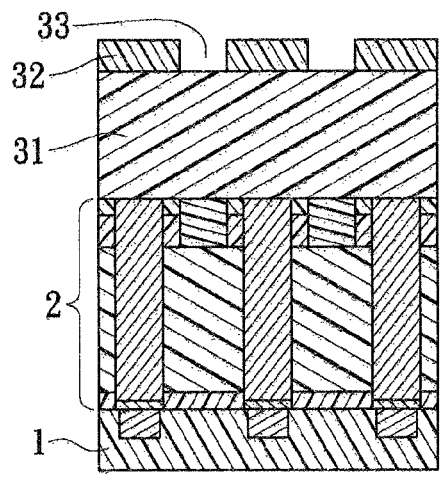
FIG. 11 is a seventh cross-sectional view showing a step of the first embodiment of the method for manufacturing capacitor lower electrodes of a semiconductor memory of the present invention.
Figure 12:
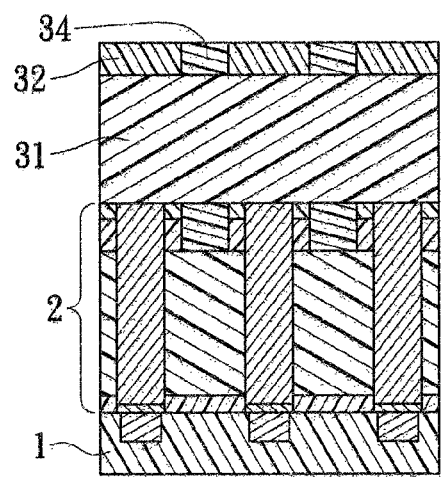
FIG. 12 is an eighth cross-sectional view showing a step of the first embodiment of the method for manufacturing capacitor lower electrodes of a semiconductor memory of the present invention.

And then, as shown in FIG. 11 and FIG. 12, the second insulating nitride layers 32 is etched partially to form a plurality of second grooves 33, and further a plurality of second dielectric boards 34 are embedded in the second grooves 33, wherein the material of the second dielectric boards 34 is insulating oxide or polysilicon.

Figure 13:
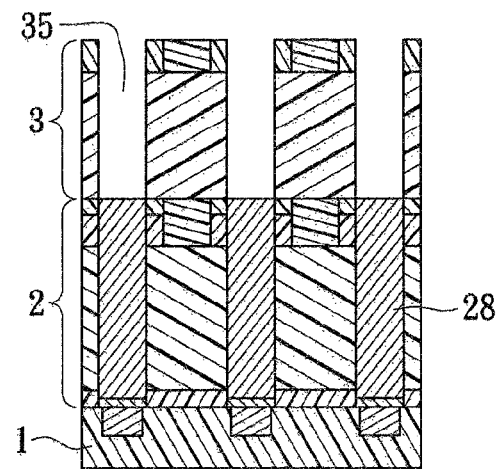
FIG. 13 is a ninth cross-sectional view showing a step of the first embodiment of the method for manufacturing capacitor lower electrodes of a semiconductor memory of the present invention.

As shown in FIG. 13, after the second dielectric boards 34 are embedded in the second grooves 33, the second insulating nitride layers 32 and the second dielectric layer 31 are etched partially to form a plurality of second trenches 35 extending from the top surfaces of the second insulating nitride layers 32 to the bottom of the second dielectric layer 31. The first conducting cylindrical structures 28 are exposed in the second trenches 35.

Figure 14:
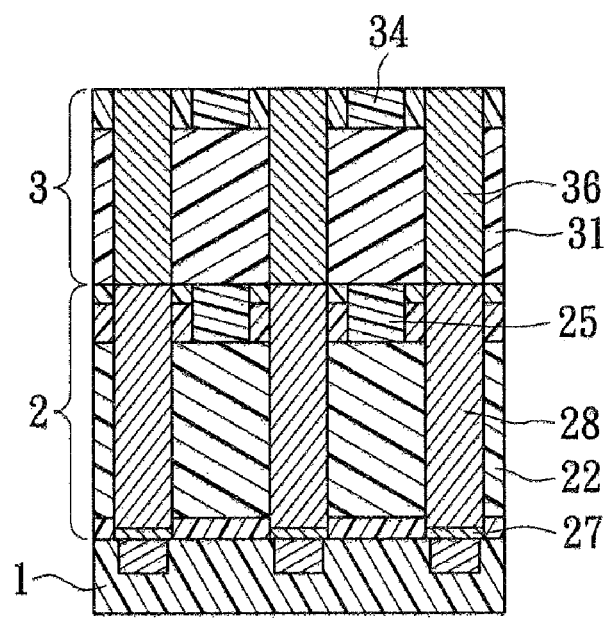
FIG. 14 is a tenth cross-sectional view showing a step of the first embodiment of the method for manufacturing capacitor lower electrodes of a semiconductor memory of the present invention.
Figure 15:
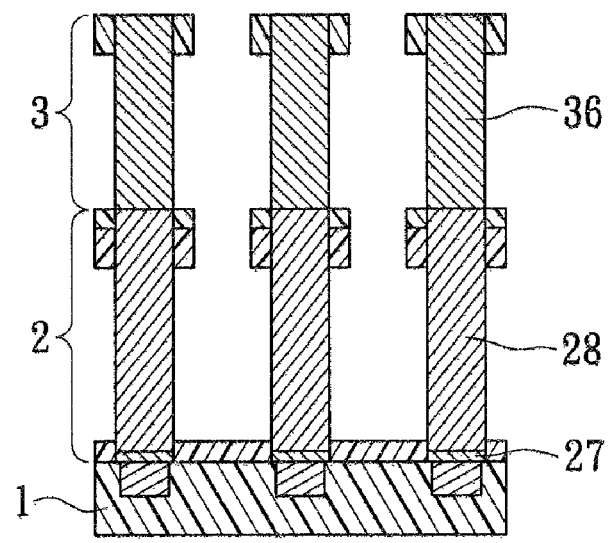
FIG. 15 is an eleventh cross-sectional view showing a step of the first embodiment of the method for manufacturing capacitor lower electrodes of a semiconductor memory of the present invention.

As shown in FIG. 14 and FIG. 15, after the second trenches 35 are formed, a second conducting cylindrical structure 36 is disposed within each second trench 35. The material of the second conducting cylindrical structures 36 is titanium nitride. The second conducting cylindrical structures 36 are deposited over the upper surfaces of the first conducting cylindrical structures 28. Finally, the first dielectric layer 22, the second dielectric layer 31, the first dielectric boards 25, and the second dielectric boards 34 are etched and removed. The first conducting cylindrical structures 28 and the second conducting cylindrical structures 36 stacked from bottom to top form as the capacitor lower electrodes.

Figure 16:
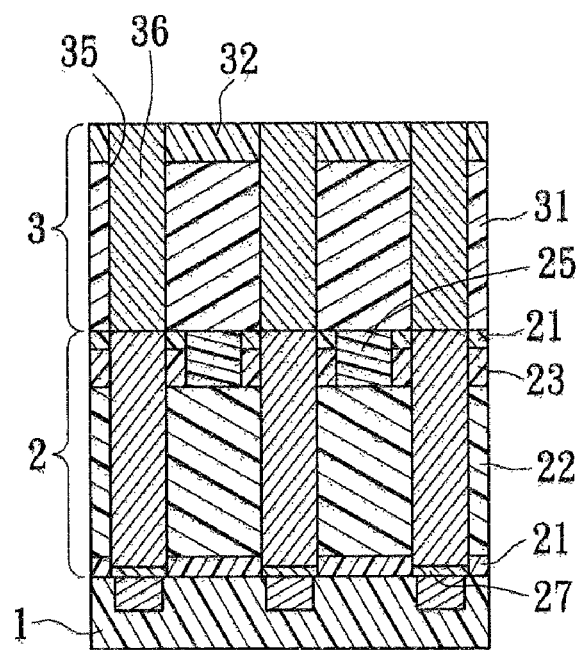
FIG. 16 is a cross-sectional view showing a step of a second embodiment of the method for manufacturing capacitor lower electrodes of a semiconductor memory of the present invention.

FIG. 16 illustrates a second embodiment of the method for manufacturing capacitor lower electrodes of a semiconductor memory of the present invention. The difference between the second embodiment and the first embodiment is that, in the second embodiment, after the second stacked structure 3 is disposed, the second trenches 35 in the second stacked structure 3 is formed directly, and then each second conducting cylindrical structure 36 is disposed in each second trench 35.

Figure 17:
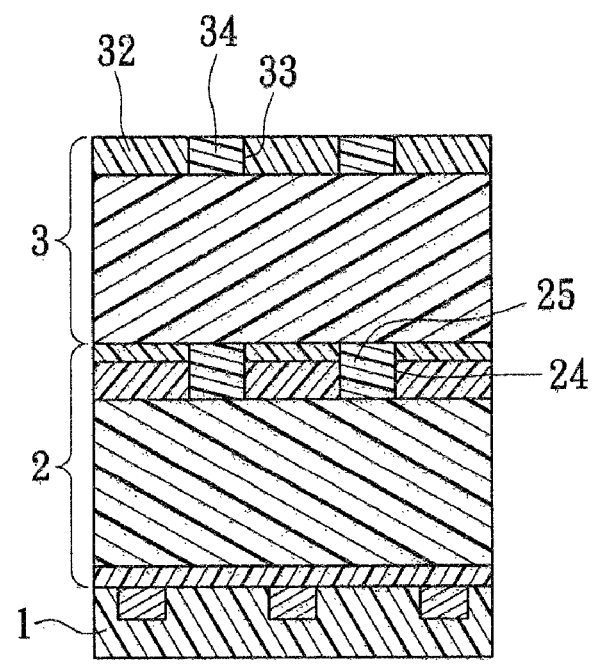
FIG. 17 is a first cross-sectional view showing a step of a third embodiment of the method for manufacturing capacitor lower electrodes of a semiconductor memory of the present invention.
Figure 18:
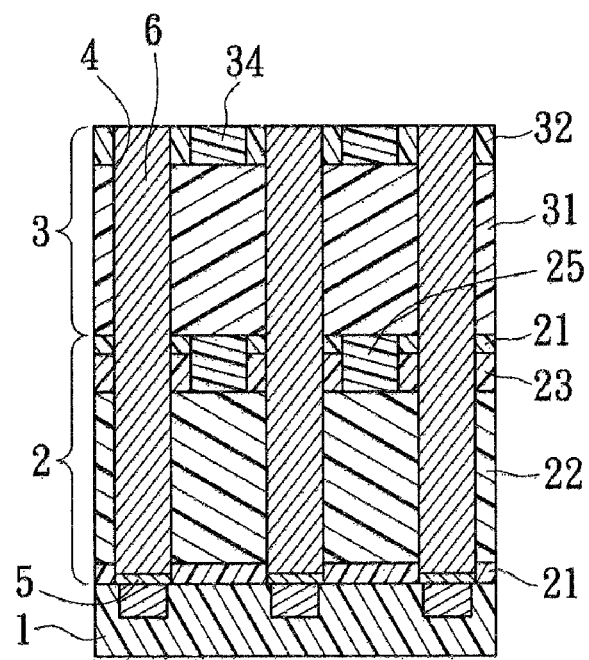
FIG. 18 is a second cross-sectional view showing a step of the third embodiment of the method for manufacturing capacitor lower electrodes of a semiconductor memory of the present invention.

FIGS. 17-18 illustrate a third embodiment of the method for manufacturing capacitor lower electrodes of a semiconductor memory of the present invention. The difference between the third embodiment and the first embodiment is that, in the third embodiment, after the first dielectric boards 25 are embedded in the first grooves 24, the second stacked structure 3 is disposed on the first stacked structure 2 initially, then the second insulating nitride layers 32 are etched to form the plurality of second grooves 33, and further the second dielectric boards 34 are embedded in the second grooves 33. After that, partial etching of the first stacked structure 2 and the second stacked structure 3 forms a plurality of trenches 4 extending from the top surface of the second stacked structure 3 to the bottom surface of the first stacked structure 2. Then, a conductive metal material 5 and a solid-column capacitor lower electrode 6 is disposed within each trench 4 in turn, and the capacitor lower electrodes 6 are deposited onto the upper surface of the conductive metal material 5

Figure 19:
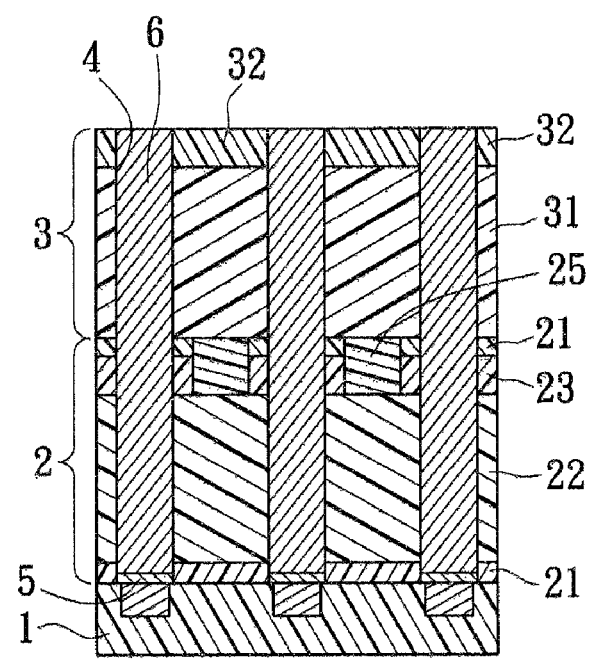
FIG. 19 is a cross-sectional view showing a step of the fourth embodiment of the method for manufacturing capacitor lower electrodes of a semiconductor memory of the present invention.

FIG. 19 illustrates a fourth embodiment of the method for manufacturing capacitor lower electrodes of a semiconductor memory of the present invention. The difference between the fourth embodiment and the third embodiment is that, in the fourth embodiment, after the second stacked structure 3 is disposed, the plurality of trenches 4 extending from the top surface of the second stacked structure 3 to the bottom surface of the first stacked structure 2 are formed directly. Then, the conductive metal material 5 and the solid cylindrical capacitor lower electrode 6 are disposed in each trench 4 in turn, and the capacitor lower electrodes 6 are deposited onto the upper surface of the conductive metal material 5

Consequently, the method for manufacturing capacitor lower electrodes of a semiconductor memory of the present invention has the beneficial effects as follows:

1. The present invention utilizes the solid-cylindrical capacitor lower electrodes 6 which have a high supporting stress, comparing with the conventional U-shaped capacitor lower electrodes, thereby reducing the difficulty in disposing of capacitor upper electrodes and capacitor dielectric layers outside the capacitor lower electrodes 6.

2. Comparing with the conventional U-shaped capacitor lower electrodes, the solid-cylindrical capacitor lower electrodes 6 have a larger surface area for storing more electric charges.

What are disclosed above are only the specification and the drawings of the preferred embodiments of the present invention and it is therefore not intended that the present invention be limited to the particular embodiments disclosed. It will be understood by those skilled in the art that various equivalent changes may be made depending on the specification and the drawings of the present invention without departing from the scope of the present invention.

What is claimed is:

1. A method for manufacturing capacitor lower electrodes of a semiconductor memory, comprising the steps of:
    forming a first stacked structure over a semiconductor substrate which has a plurality of conductive plugs, the first stacked structure includes two first insulating oxide layers, a first dielectric layer and a first insulating nitride layer, the first dielectric layer and the first insulating nitride layer are interposed there between the two first insulating oxide layers, the first insulating nitride layer is deposited onto the first dielectric layer;
    etching the first stacked structure to form a plurality of first trenches in which the conductive plugs are exposed;
    disposing a conductive metal material within each of the first trenches to cover the conductive plugs;
    disposing a solid first conducting cylindrical structure within each of the first trenches, the first conducting cylindrical structures are deposited over the conductive metal materials;
    forming a second stacked structure on the first stacked structure, the second stacked structure includes a second dielectric layer and a second insulating nitride layer from bottom to top;
    etching the second stacked structure to form a plurality of second trenches in which the first conducting cylindrical structures are exposed; and
    disposing a solid second conducting cylindrical structure within each of the second trenches, the second conducting cylindrical structures are deposited over the first conducting cylindrical structures.

2. The method as claimed in claim 1, further comprising the step of etching the first insulating oxide layers and the first insulating nitride layer to form a plurality of first grooves and then embedding a plurality of first dielectric boards in the first grooves before forming the first trenches.

3. The method as claimed in claim 1, further comprising the step of etching the second insulating nitride layer to form a plurality of second grooves before forming the second trenches.

4. The method as claimed in claim 3, further comprising the step of disposing a plurality of second dielectric boards into the second grooves after forming the second grooves.

5. The method as claimed in claim 1, further comprising the step of etching and removing the first dielectric layer and the second dielectric layer after forming the second conducting cylindrical structures.

6. The method as claimed in claim 1, wherein the first dielectric layer is an insulating material piece or a conductive material piece.

7. The method as claimed in claim 1, wherein the second dielectric layer is an insulating material piece or a conductive material piece.

8. The method as claimed in claim 2, where the first dielectric boards are insulating material pieces or conductive material pieces.

9. The method as claimed in claim 4, wherein the second dielectric boards are insulating material pieces or conductive material pieces.

10. A method for manufacturing capacitor lower electrodes of a semiconductor memory, comprising the steps of:
    forming a first stacked structure over a semiconductor substrate which has a plurality of conductive plugs, the first stacked structure includes two first insulating oxide layers, a first dielectric layer and a first insulating nitride layer, the first dielectric layer and the first insulating nitride layer are interposed there between the two first insulating oxide layers, the first insulating nitride layer is disposed on the first dielectric layer;
    forming a second stacked structure on the first stacked structure, the second stacked structure includes a second dielectric layer and a second insulating nitride layer from bottom to top;
    etching the first stacked structure and the second stacked structure to form a plurality of trenches extending from a top surface of the second stacked structure to a bottom surface of the first stacked structure, in which the conducting plugs are exposed in the trenches;
    disposing a conductive metal material within each of the trenches to cover the conductive plugs; and
    disposing a cylindrical capacitor lower electrode within each of the trenches, the capacitor lower electrodes are deposited over the conductive metal materials.

11. The method as claimed in claim 10, further comprising the step of etching the first insulating oxide layers and the first insulating nitride layer to form a plurality of first grooves and then embedding a plurality of first dielectric boards into the first grooves before forming the second stacked structure.

12. The method as claimed in claim 10, further comprising the step of etching the second insulating nitride layer to form a plurality of second grooves before forming the trenches.

13. The method as claimed in claim 12, further comprising the step of disposing a plurality of second dielectric boards into the second grooves after forming the second grooves.

14. The method as claimed in claim 10, further comprising the step of etching and removing the first dielectric layer and the second dielectric layer after forming the capacitor lower electrodes.

15. The method as claimed in claim 10, wherein the first dielectric layer is an insulating material piece or a conductive material piece.

16. The method as claimed in claim 10, wherein the second dielectric layer is an insulating material piece or a conductive material piece.

17. The method as claimed in claim 11, wherein the first dielectric boards are insulating material pieces or conductive material pieces.

18. The method as claimed in claim 13, wherein the second dielectric boards are insulating material pieces or conductive material pieces.

* * * * *